United States Patent [19]

Fishburn

[11] Patent Number: 5,845,233
[45] Date of Patent: Dec. 1, 1998

[54] METHOD AND APPARATUS FOR CALIBRATING STATIC TIMING ANALYZER TO PATH DELAY MEASUREMENTS

[75] Inventor: John Philip Fishburn, Murray Hill, N.J.

[73] Assignee: Lucent Technologies, Inc., Murry Hill, N.J.

[21] Appl. No.: 902,997

[22] Filed: Jul. 30, 1997

[51] Int. Cl.[6] .................................................. G01C 25/00
[52] U.S. Cl. ............................. 702/108; 702/57; 702/90; 702/117; 364/488; 364/489; 364/490; 364/491; 364/578
[58] Field of Search ............................... 364/571.01, 488, 364/489, 490, 491, 578; 371/2.1, 2.8, 5.5, 61, 62; 702/57, 90, 117, 108

[56] References Cited

U.S. PATENT DOCUMENTS

| | | | |
|---|---|---|---|
| 5,367,469 | 11/1994 | Hartoog | 364/491 |
| 5,461,576 | 10/1995 | Tsay et al. | 364/490 |
| 5,553,001 | 9/1996 | Seidel et al. | 364/488 |
| 5,553,008 | 9/1996 | Huang et al. | 364/578 |
| 5,619,418 | 4/1997 | Blaauw et al. | 364/489 |
| 5,633,807 | 5/1997 | Fishburn et al. | 364/491 |

*Primary Examiner*—John E. Barlow, Jr.
*Assistant Examiner*—Hien Vo

[57] ABSTRACT

A method for calibrating a circuit analyzer includes determining a plurality of initial technology parameters characterizing the circuit according to a timing model of the circuit. A delay along an entire logic path of the circuit is expressed as a function of the technology parameters. A benchmark set of circuit paths is determined which has fixed topology, device sizes, and wire capacitances. The technology parameters are then optimized to minimize error over the set of circuit paths to obtain optimized parameters for use in the timing model. The optimized technology parameters minimize the average error for the benchmark set of paths relative to SPICE or physical measurements. Average error is significantly reduced on a representative set of paths when compared to the conventional approach of separately measuring each parameter.

15 Claims, 4 Drawing Sheets

METHOD AND APPARATUS FOR CALIBRATING STATIC TIMING ANALYZER TO PATH DELAY MEASUREMENTS

FIELD OF THE INVENTION

The invention pertains to the field of static timing analysis, and in particular, to a method for linking a constrained nonlinear optimizer to a static timing analyzer in order to determine a complete set of technology parameters that minimizes errors for a set of path delay measurements, while requiring each error to be conservative.

BACKGROUND OF THE INVENTION

Simulation techniques are used by chip and circuit designers to predict and verify the performance of a given circuit. Simulation techniques vary between being highly accurate but requiring a long simulation time and being slightly accurate but requiring a short simulation time. Increased accuracy decreases the simulation speed and vice versa. The most detailed and accurate simulation techniques is referred to as Circuit Analysis.

Typical circuit analysis programs are the SPICE program developed at the University of California at Berkeley and the ASTAP program developed at IBM. The basis for this type of program is the solution of matrix equations relating circuit voltages, currents, and resistances or conductances. Simulation times are typically proportional to $N^m$, where N is the number of nonlinear devices in the circuit and m is between 1 and 2. These programs are therefore primarily used for either small circuits or to provide a benchmark for verifying the simulation results of faster but less accurate simulators, such as timing simulators.

Linear RC networks are used to model gate delays in many static timing analyzers for MOS synchronous circuits. By calculating delays with simple formulas involving technology and circuit parameters, rather than with time-consuming numerical integration, very fast runtimes are achieved. One weakness of this approach is that the reduction of a MOS circuit to a linear RC network involves many simplifying assumptions that contribute to timing error, such as:

(1) the nonlinear MOS transfer characteristic is represented by a linear resistor in series with a switch,
(2) complex signal waveforms are represented by a 50% crossing time, and perhaps by a slope,
(3) the nonlinear capacitances of the drain, gate, and source are represented by linear capacitances,
(4) Miller capacitance is ignored,
(5) the body effect is ignored, and
(6) complex CMOS static gates are reduced to RC ladders, whose delay is calculated using the Elmore approximation.

The resulting error significantly reduces the usefulness of the static timing analyzer, because in order to compensate for the error, the user must overdesign the circuit by a margin not less than the error. This in turn wastes power or limits the fastest speed to which the circuit can be confidently designed.

During startup, a static timing analyzer reads a file of numerical parameters that characterize the process in which the circuit is implemented. Each technology parameter represents some physically meaningful quantity, such as capacitance and resistance, and is usually determined from a simulator process file by a series of measurements using a circuit simulator. For a given circuit fed to the static timing analyzer, the technology parameters are used to determine individual gate delays, which are then summed along a path to determine path delay. For each path, there will be some discrepancy or error between this path delay and "actual" delay measured either physically or by a "gold standard" circuit simulator.

In most clocking methodologies, correct operation is achieved by ensuring that every path delay between flip-flops is less than the clock period. In the face of timing error, the user might accomplish this by a conservative policy that overdesigns each path by an amount more than the error. Alternatively, the analyzer can assume the responsibility for this conservatism by applying a derating factor greater than one to all delays it reports, or equivalently, by applying the same factor to the device resistance values when they are read from the technology file. As long as the analyzer's errors are conservative, the circuit will work at the reported frequency.

A typical static timing analyzer is the TILOS transistor size optimizer. Table 1 shows sample technology parameters values for a timing model. Parameters for NFETs and PFETs, respectively, start with the letters "N" and "P". For example, an NFET with a channel length of NCL microns and a channel width of w microns drives a C picofarad load in C*NR1MIC /w nanoseconds, has a gate capacitance NCGTA*NCL*w+2*NCGTP*(NCL+w), and a drain or source capacitance NCJA*NDX*w+2*NCJP*(NDX+w). NDX is the distance the N-type diffusion extends out from the channel so that the source and drain regions of an NFET with channel width w are w by NDX rectangles.

TABLE 1

| NFET, PFET Parameters | Typical Value | Description |
| --- | --- | --- |
| NCGTA | $2.51 \times 10^{-3}$ pf · $\mu m^{-2}$ | gate area capacitance |
| PCGTA | $2.51 \times 10^{-3}$ pf · $\mu m^{-2}$ | |
| NCGW | $3.61 \times 10^{-4}$ pf · $\mu m^{-1}$ | gate perimeter |
| PCGPT | $3.61 \times 10^{-4}$ pf · $\mu m^{-1}$ | capacitance |
| NCJA | $6.35 \times 10^{-4}$ pf · $\mu m^{-2}$ | diffusion area |
| PCJA | $4.19 \times 10^{-4}$ pf · $\mu m^{-2}$ | capacitance |
| NCJP | $4.83 \times 10^{-4}$ pf · $\mu m^{-1}$ | diffusion perimeter |
| PCJP | $3.26 \times 10^{-4}$ pf · $\mu m^{-1}$ | capacitance |
| NR1MIC | $1.19 \times 10^{4}$ ns · $\mu m$ · $pf^{-1}$ | resistance of |
| PR1MIC | $2.90 \times 10^{4}$ ns · $\mu m$ · $pf^{-1}$ | 1 $\mu m$ FET |

For example, suppose that an NFET with channel width $X_1$ drives its own drain capacitance, the gate capacitance of a second NFET with channel width $X_2$, and a wire capacitance W. The time required to do this is:

$$\frac{NR1MIC}{X_1} \times (NCJA \times NDX \times X_1 + 2 \times NCJP \times (NDX + X_1) + NCGTA \times NCL \times X_2 + 2 \times NCGTP \times (NCL + X_2) + W)$$

In a conventional calibration method, each parameter is measured by a SPICE simulation, or by copying the parameter value directly from the SPICE process file. For example, the capacitance per unit area for N-type diffusion might be determined by a simulation in which N-type diffusion of a certain area is charged to $V_{DD}$ through a linear resistor. An equivalent linear capacitance is determined as the capacitance that would take the same amount of time to charge to 50% of $V_{DD}$. The eight capacitance parameters are determined in this way.

The two resistance parameters are also determined by simulation. To determine NR1MIC, a simulation measures the time t required for an NFET of a certain size W0 with step input to discharge a linear capacitance C. The resistance parameter NR1MIC is then determined by the formula NR1MIC=tW0D/C, where D is a derating factor applied to both NFETs and PFETS to make the static timing analyzer conservative on a representative set of paths.

A drawback to a conventional simulation procedure is that the average error of the delay determined by the simulation compared to the actual delay as measured physically contributes to timing errors or unnecessary overdesign parameters.

SUMMARY OF THE INVENTION

Briefly stated, a method for calibrating a circuit analyzer includes determining a plurality of initial technology parameters characterizing the circuit according to a timing model of the circuit. A delay along an entire logic path of the circuit is expressed as a function of the technology parameters. A benchmark set of circuit paths is determined which has fixed topology, device sizes, and wire capacitances. The technology parameters are then optimized to minimize error over the set of circuit paths to obtain optimized parameters for use in the timing model. The optimized technology parameters minimize the average error for the benchmark set of paths relative to SPICE or physical measurements. Average error is significantly reduced on a representative set of paths when compared to the conventional approach of separately measuring each parameter.

DESCRIPTION OF THE PREFERRED EMBODIMENT

Normally, path delay is viewed as a function of circuit parameters, such as device sizes and wire capacitances. In the present invention, path delay is considered to be a function of the technology parameters, which are adjusted to minimize error over a set of paths with fixed topology, device sizes, and wire capacitances. When the technology parameters are viewed as variables, and the circuit topology and device sizes are viewed as constant, then the delay along an entire logic path is expressed as:

$$\sum_{i=1}^{2} \sum_{j=1}^{8} I_{ij} R_i C_j + \sum_{i=1}^{2} W_i R_i \qquad (1)$$

where $R_1$ and $R_2$ denote NR1MIC and PR1MIC, $C_1$–$C_8$ denote the eight capacitance parameters of Table 1, $W_i$ represents the total wire capacitance along the path being driven by $R_i$, and $I_{ij}$ represents the aggregate amount, along the entire path, of capacitance $C_j$ driven by resistance $R_i$.

Although static timing analyzers typically make many approximating assumptions, the calibration process according to the present invention partially compensates for these approximations by assigning "nonphysical" values to the parameters to form pseudo-physical parameters. Thus for a fixed set of benchmark paths, the sum of squares of the errors are a function of the values of the technology parameters. The interpretation of the parameters as physically measurable quantities is disregarded, thus treating them as independent variables to be manipulated in order to minimize the error. The parameters are determined by varying them within an optimization program so as to best fit timing model path delays to measurements.

Figure 1:
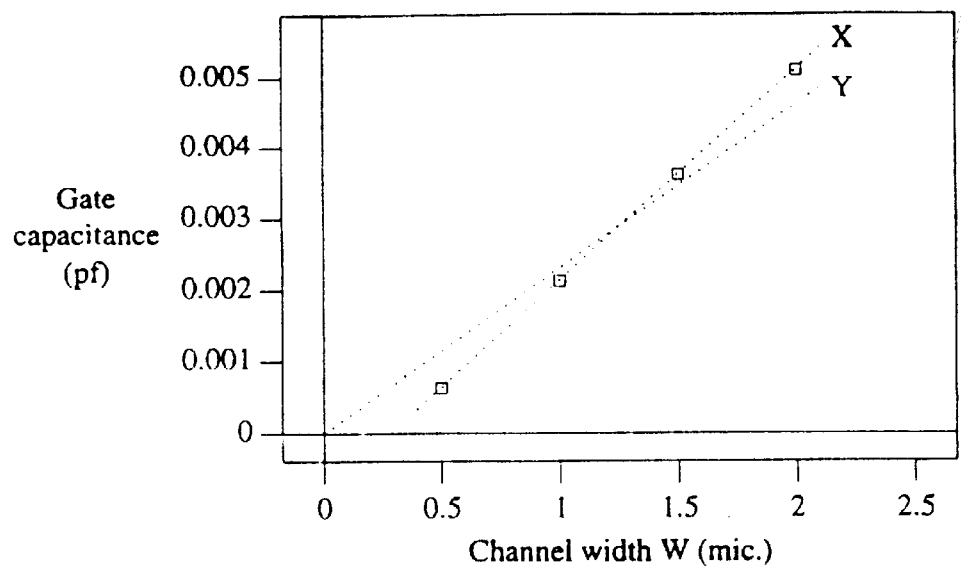
FIG. 1 shows a calibrating analysis model compared to a simulation model.

In FIG. 1, for example, a calibrating analysis model is represented by dotted lines and a simulation model is represented by squares. The gate area and perimeter capacitance parameters of a static timing analysis model are preferably determined so as to best match those of the circuit simulation model of FIG. 1. A and P denote the per-area and per-perimeter linear capacitance in the simulation model, and A' and P' the corresponding parameters in the static timing analyzer. In both models the channel length is L.

The "approximation" of the static timing model consists of the fact that in the simulation model, the width is adjusted by a parameter $D_W$ before calculating capacitances, whereas the analysis model has no such adjustment. In a $0.9\mu$FET channel length slow process, $D_W$ is typically in the range $-0.3$ to $-0.5\mu$. A "slow process" is one in which deleterious variations in the manufacturing process may have occurred. These variations can be captured in a SPICE "slow process file." In the simulation model, the total simulation gate capacitance $C_S$ of a FET of width W equals the area capacitance plus the perimeter capacitance, which is:

$$C_S = (W + D_W)LA + 2P(W + D_W + L) \qquad (2)$$

By contrast, in the analysis model, which has no $D_W$ correction, the analysis total gate capacitance $C_A$ equals $$C_A = WLA' + 2P'(W + L) \qquad (3)$$

Placing both these formulas into the form aW+b, we obtain $$C_S = (LA + 2P)W + D_W LA + 2P(D_W + L) \qquad (4)$$

and $$C_A = (LA' + 2P')W + 2P'L$$

In both the simulation and analysis models, the gate capacitance is a straight-line function of W. In the simulation model, the effect of a decrease in $D_W$ is to decrease the y-intercept of this line. Decreasing P' in the analysis model has the same effect. Since there are two free parameters in the analysis model, A' and P', the analysis model can be calibrated precisely to the simulation model with no error whatsoever, no matter what the values of $D_W$, A, and P.

This is achieved by setting $$P' = \frac{D_W LA + 2P(D_W + L)}{2L}$$

and $$A' = \frac{LA + 2P - 2P'}{L}$$

in the analysis model. If $D_W=0$, then $P'=P$ and $A'=A$, but if $D_W<0$, the P' must decrease to compensate, possibly even becoming negative. In FIG. 1, when P' is constrained to be positive, the best fit, Y, is poor. When the constraint is removed, the best fit, X, is perfect.

This example is sufficiently simple that the apparent paradox is easily explained. The analysis model, although based on physical considerations, is only an approximation to reality. If it were exact, instead of approximate, then we would demand that the parameter values correspond to physical measurements. However, to the extent that it is not exact, there is no "reality" to be preserved, so that the calibration process does the best it can to match one model to the other by adjusting the parameter values away from physically measured values.

There are other cases where nonphysical parameter values may improve the accuracy of approximate models. For example, if gate A drives the input to gate B, a good approximation to the input slope effect on B's delay is made by adding a certain fraction of A's step input delay ($STEP_A$) to B's step-input delay ($STEP_B$). If this fraction is denoted by $f$, the delay of B, taking into account input slope, is then written $SLOPE_B=STEP_B+f \cdot STEP_A$. The terms that contain $STEP_A$ are gathered together to calculate the delay of a path that contains A and B, yielding $(1+f) \cdot STEP_A$. Thus, by changing $STEP_A$'s coefficient from 1 to $(1+f)$, a step-input model yields the same path delay as a slope-input model (except for the last gate in the path).

Another example occurs in the case of Miller capacitance, where the effective gate capacitance must be increased to account for the drain swinging in the opposite direction from the gate.

An optimization methodology for performing constrained or unconstrained nonlinear optimization, such as MINOS, manipulates the values of the independent variables and passes them to user-supplied routines that compute the objective and constraint functions. MINOS and user supplied routines are linked together to form a single executable. MINOS exits when it decides that convergence has been achieved.

The optimization methodology and the static timing analyzer are linked to form a combined methodology that calibrates the static timing analyzer. For example, TILOS and MINOS are linked to form an executable TILOS-MINOS. TILOS-MINOS is called from within a script that also performs SPICE simulations and collects the measured results from these simulations for input to TILOS-MINOS. In turn, the script is directed by a user-supplied control file that specifies the set of calibration paths, the SPICE process file, temperature and voltage, simple bounds on variables, and whether all errors are constrained as conservative. The set of calibration paths used in this example consists of 90 paths that represent a diverse and complete collection of delay sources. Channel lengths are represented symbolically, so that they can be set to their process value. Channel widths are coded explicitly, but are scaled to fall within minimum and maximum allowed widths for the process. Each variable is preferably scaled so that the optimizer believes it is in the range 1.0 to 10.0, give or take a few orders of magnitude.

For a given path k, the error is the difference between the model delay given by (1) and the delay $M_k$ as measured by SPICE:

$$\sum_{i=1}^{2} \sum_{j=1}^{8} I_{ijk} R_i C_j + \sum_{i=1}^{2} W_{ik} R_i - M_k$$

The optimization process minimizes the sum of the squares of these errors. If the user chooses to do so, the process also constrains each error as "conservative", i.e., non-negative. The user optionally specifies a starting point for the optimization. The final answer does not depend on the starting point. However, a good starting point does greatly decrease the runtime. The parameter values from the conventional calibration method are preferably used for this purpose.

EXAMPLE

To illustrate the improvement due to the calibration method of the present invention, 1,122 paths are extracted from a $0.9\mu$ 32-bit carry-lookahead adder layout and simulated with SPICE. These paths, which are completely separate from the 90 paths that make up the calibration set, represented a mix of logic gates (inverters, NANDs, NORs, AOIs, OAIs, and CMOS transmission gates) as well as a wide spread of wire capacitance values.

Figure 2:
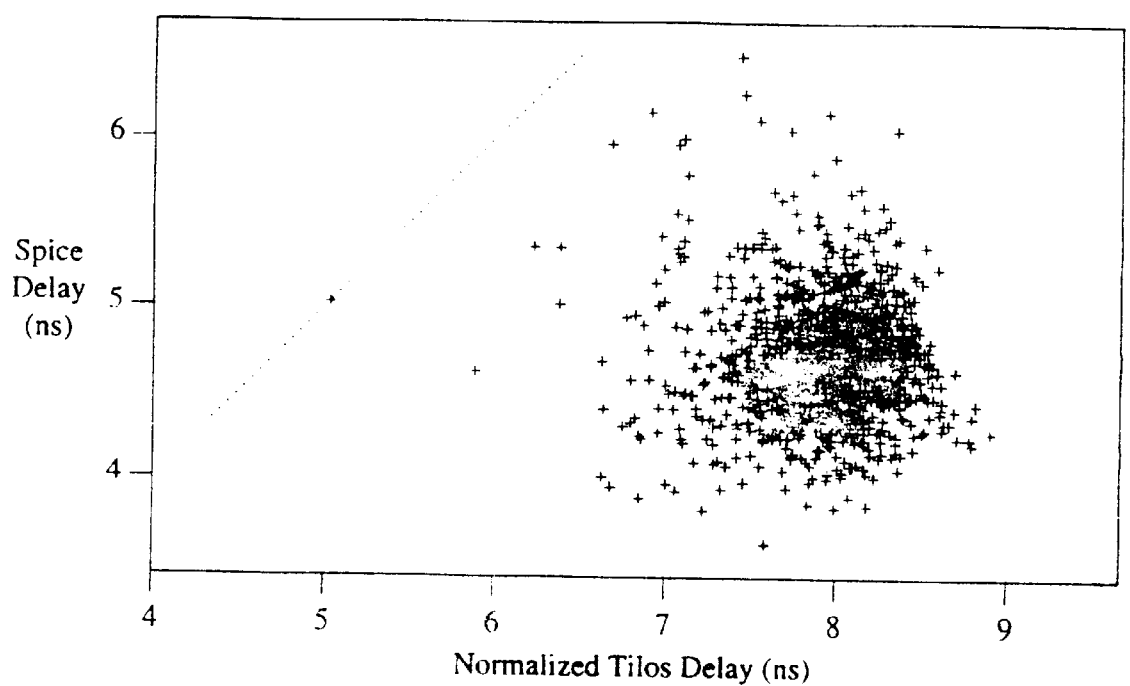
FIG. 2 shows a scatter diagram of TILOS delays vs. SPICE delays when the TILOS parameters are determined by a conventional method.

First, the TILOS parameters are determined by the original (conventional) method. FIG. 2 is a scatter diagram of TILOS vs. SPICE delays for the 1,122 paths. In this scatter diagram, as well as in FIGS. 3–6, each point represents one of the 1,122 paths. In addition, the scale and range of both axes are kept fixed in FIGS. 2–6 to enable visualization of the trend in error reduction. The y-coordinate is the path delay as measured by SPICE, which remains fixed. The x-coordinate is the path delay in the TILOS timing analysis model, which varies as different calibration methods are used. In each scatter diagram, all TILOS delays are normalized by a single factor to be conservative, that is, all the TILOS path delays are multiplied by a normalizing constant which is equal to the maximum, over all the paths, of the SPICE path delay divided by the TILOS path delay. Thus, by definition, the x-coordinate is never less than the y-coordinate, and for at least one point, the x-coordinate and y-coordinate are equal. After this normalization, the average error is 3.19 ns.

Figure 3:
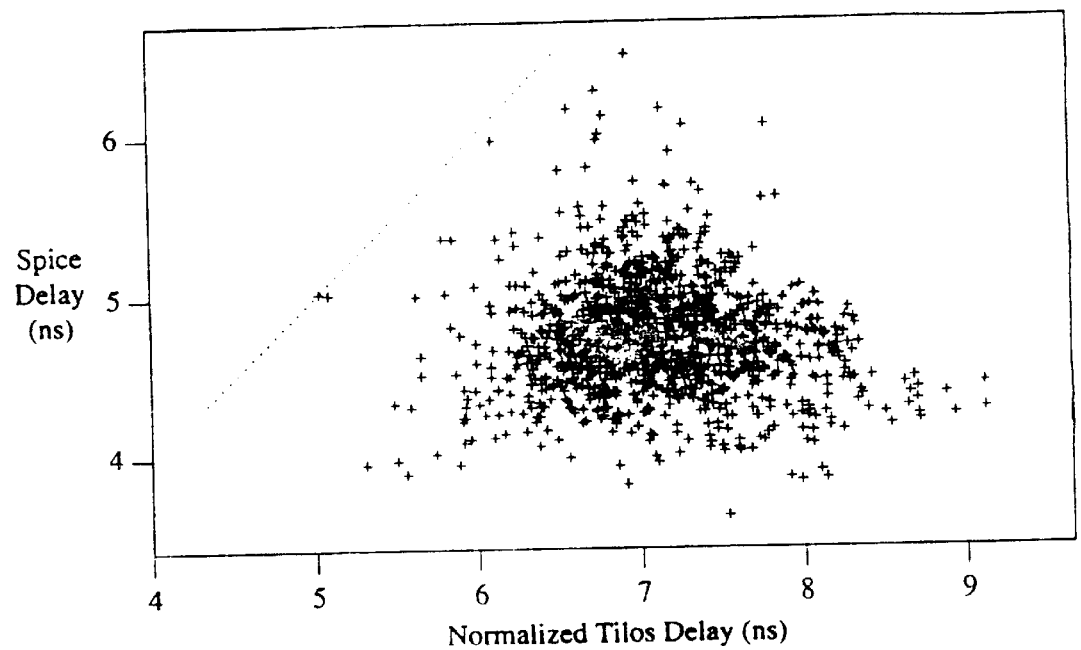
FIG. 3 shows a scatter diagram of TILOS delays vs. SPICE delays when the TILOS parameters are determined by a method of the present invention with a constraint that all errors must be conservative.

Referring to FIG. 3, the SPICE and TILOS delays for the calibration method of the present invention are shown. The average error is reduced error to 2.37 ns., which is a 26% reduction from the conventional method.

Figure 4:
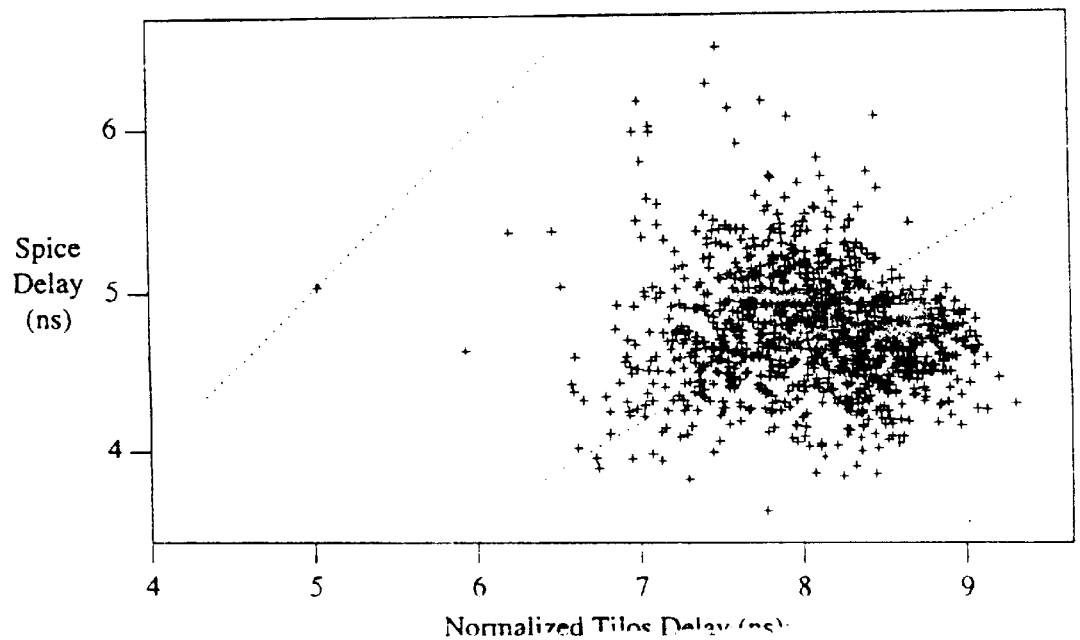
FIG. 4 shows a scatter diagram of TILOS delays vs. SPICE delays when the TILOS parameters are initially determined by a method of the present invention but without the constraint that all errors must be conservative.

Referring to FIG. 4, the SPICE and TILOS delays for an unconstrained optimization-based calibration method are shown. The TILOS parameters are initially determined without the constraint that all errors must be conservative. The TILOS delays are then multiplied by a single multiplicative factor to ensure that all are conservative. The optimization tries to minimize the sum of squares of distances to the lower dotted line (pre-normalized x=y), but this is counterproductive after all TILOS delays are normalized to be conservative (to the right of the x=y line). The optimization is done so that the sum of squares of errors is minimized, but without the constraint that all errors must be conservative. Although the method succeeds by its own standard of optimization, i.e., minimizing the sum of the squares of the distances to the line representing TILOS__ unnormalized_delay=SPICE_delay (the lower dotted line), the average error actually increases to 3.34 after all the TILOS delays are derated to make them conservative. This results is 5% more error than in the conventional approach.

The calibration process of the present invention can be used to improve the static timing analysis timing model. This process is illustrated by two instances in which error is reduced by model changes. When two or more sources of error are present, it is frequently difficult to identify any single one of them. If one is removed, the remaining source of error stands out more clearly. Thus, when calibration error is eliminated, it becomes relatively easier to identify and correct the remaining sources of error.

Figure 5:
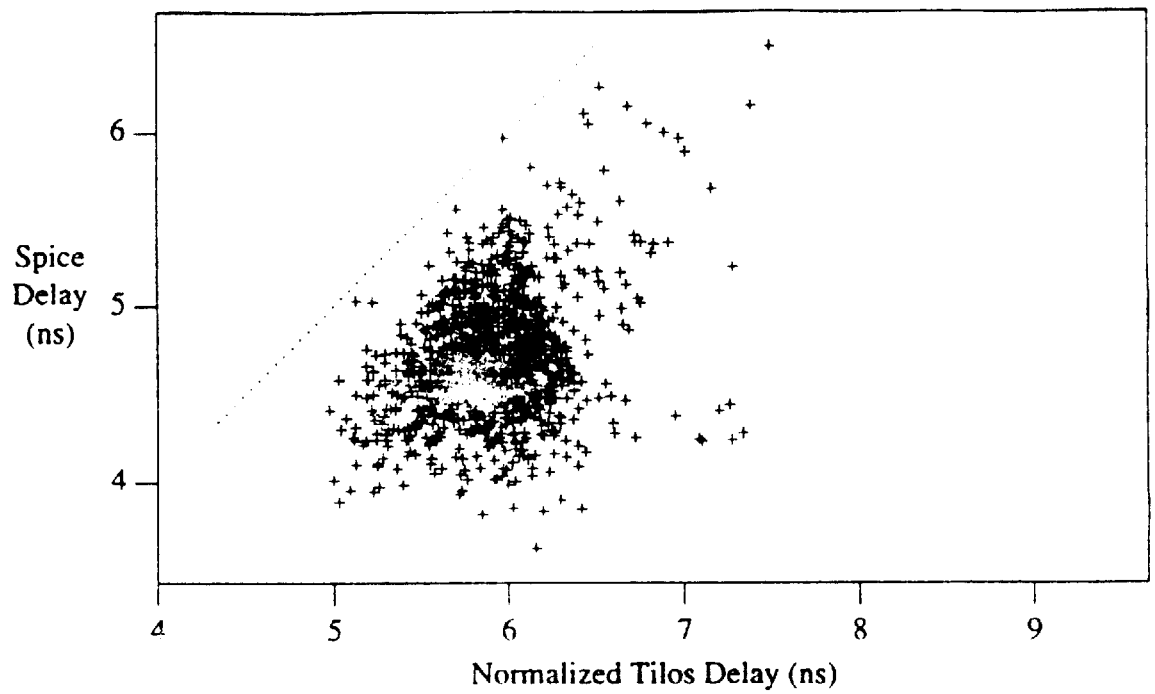
FIG. 5 shows a scatter diagram of TILOS delays vs. SPICE delays when the TILOS parameters are determined by a method of the present invention with width correction terms used.

Referring back to FIG. 3, the paths with the highest values of SPICE_delay/TILOS_delay have a large portion of the delay coming from gates with small driving transistors, whereas paths with the lowest values of SPICE_delay/TILOS_delay do not have any delay due to small driving transistors. Although the area and perimeter capacitance parameters can be manipulated to account for the missing $D_W$ term in capacitance calculations, this is not possible for resistance calculations. Therefore, a significant source of model error is the fact that the SPICE model has a width correction term, "DW" while the TILOS model does not. When these width-correction terms, PDW and NDW, are added to the TILOS model and the optimization procedure run again, the average error is cut in half, from 2.37 ns. to 1.18 ns. The resulting distribution of TILOS vs. SPICE delays is shown in FIG. 5.

Figure 6:
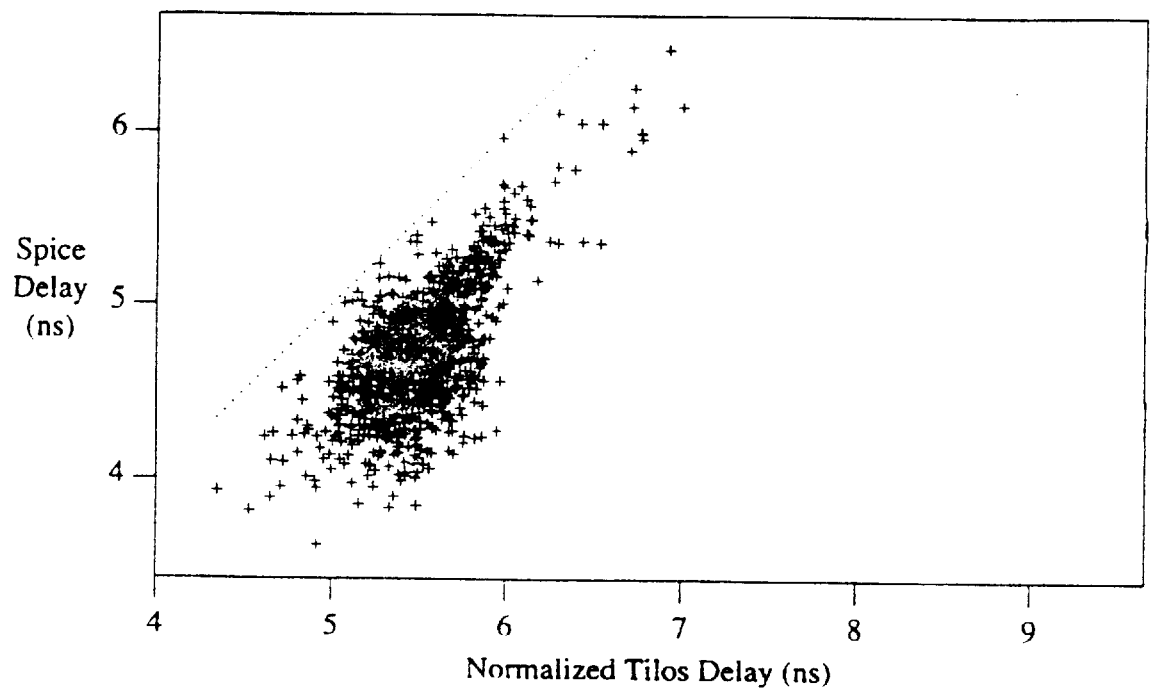
FIG. 6 shows a scatter diagram of TILOS delays vs. SPICE delays when the TILOS parameters are determined by a method of the present invention with an improvement consisting of adding certain parameters to the model.

A similar process is followed to determine a second potential model improvement. This improvement consists of adding, in complex gates, a certain percentage of side-chain source-drain capacitance to the gate outputs. The resulting distribution of TILOS vs. SPICE delays is shown in FIG. 6. This change yields a further 36% reduction in average error, from 1.18 ns. to 0.76 ns.

Thus, static timing analysis error is reduced by 26% on a representative set of paths by determining technology parameters jointly, with an optimizer, instead of with separate measurements. Equally large error reductions are therefore possible in users' designs. This method is applicable to other static timing analyzers, as well as in other models that use physical approximations, such as timing simulation models. The optimization process constrains all errors as conservative. By eliminating error due to suboptimal parameter settings, model deficiencies are made more apparent, thus enabling model improvements. By using a sufficiently comprehensive set of paths for calibration, the warped-board phenomenon is avoided in which forcing accuracy in one corner of the design space causes unacceptable error in some other corner. If provided with a set of paths covering all relevant corners, the least-squares minimization does an excellent job of reducing error in the entire design space.

Optimization-based calibration has other advantages in addition to increased accuracy. The calibration procedure does not need to understand the static timing analysis model or the SPICE process model. Each model can be thought of as a black box that inputs technology parameters and outputs delays of particular paths. For example, if the conventional calibration procedure reads parameter values directly from the SPICE process file, a problem arises if the model changes or even if the names change. The optimization-based procedure avoids this problem entirely by using only the results of the simulation.

The user can request that all errors be conservative. The optimizer does a better job than the more straightforward approach of unconstrained error minimization, followed by derating the reported delays by a single fudge-factor. This is because the optimizer has many degrees of freedom (all the independent variables), whereas the fudge-factor is a single degree of freedom. The optimization method automatically adapts optimally to any approximations in the static timing analysis model. The procedure easily and automatically accommodates changes in the static timing analysis model. This is true even if the change represents the introduction or elimination of a bug. If the timing analysis code suddenly starts multiplying all delays by some large value, the calibration automatically divides the NFET and PFET resistances by the same value. No modification of the optimization program is necessary if the change to the model does not require new technology parameters. If new technology parameters are introduced, these must be added to the set that MINOS manipulates and communicates to TILOS.

If a user has a case where the path delay reported by the static timing analyzer is non-conservative, this is preferably viewed as a bug in the calibration procedure which is fixed by adding the path in question to the calibration set. The most significant advantage of the optimization-based procedure is that it helps point the way toward improvements in the timing model. By removing all error due to suboptimal parameter values, the spotlight is turned onto the flaws in the model itself because these are the only errors left. By examining paths with the most extreme error, the model flaws are readily apparent.

If the set of paths in the calibration process is not sufficiently comprehensive, there may be other paths in users' designs whose accuracy is made worse, although the accuracy is improved for those paths that are used in the calibration process set. To counter this possibility, a large and diverse set of paths is included in the calibration set. The end result is that users experience the same degree of improvement in accuracy as occur within the calibration set. When paths are reported with non-conservative errors, these paths are preferably added to the calibration set. With the calibration process of the present invention, there are no known paths for which the calibrated TILOS reports a delay less than SPICE.

Figure 7:
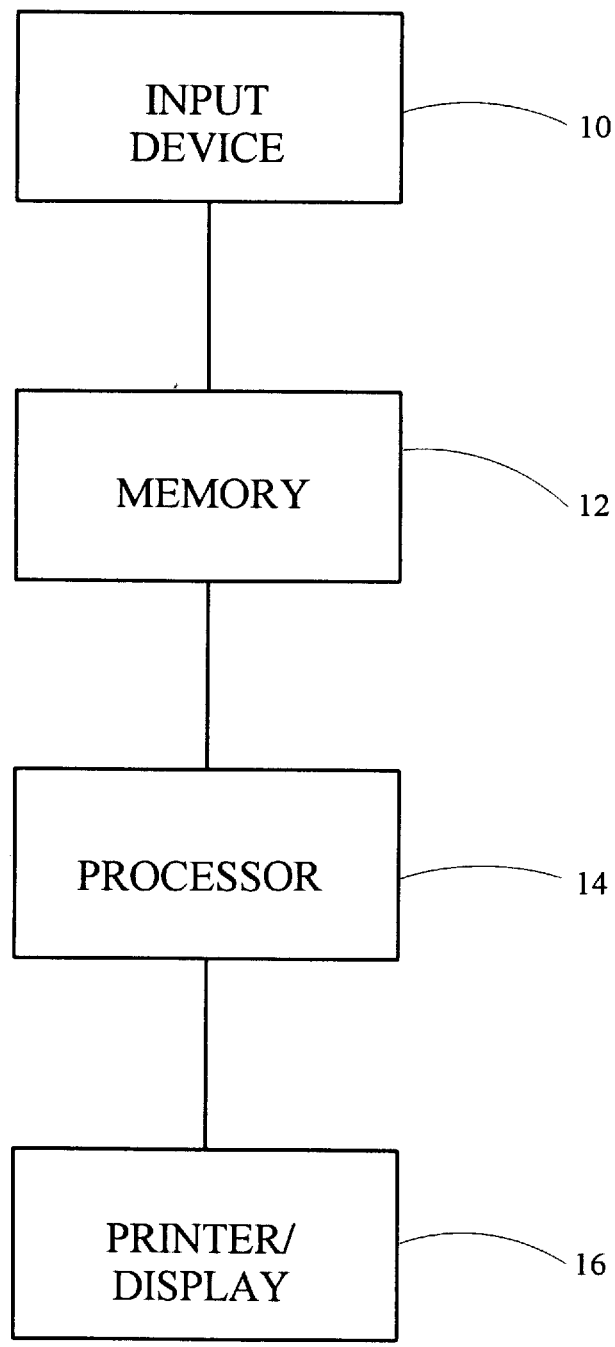
FIG. 7 shows a block diagram of an apparatus according to the present invention.

Referring to FIG. 7, a circuit analyzer includes an input device 10 for inputting a plurality of circuit parameters representing the circuit being analyzed. The circuit parameters are stored in a memory 12, as is a delay, expressed as a function of the circuit parameters, along an entire logic path of the circuit. In addition, a set of circuit paths are determined which preferably have fixed topology, device sizes, and wire capacitances. A processor 14, such as a computer, processes the circuit parameters to predict the performance of the circuit. Processor 14 then optimizes the circuit parameters to minimize a plurality of errors over the set of circuit paths to obtain optimized parameters that are iteratively used by processor 14. A graphic representation of the processed circuit parameters are printed or displayed on a printer/display 16.

Accordingly, it is to be understood that the embodiments of the invention herein described are merely illustrative of the application of the principles of the invention. Reference herein to details of the illustrated embodiments are not intended to limit the scope of the claims, which themselves recite those features regarded as essential to the invention.

What is claimed is:

1. A method of calibrating a circuit analyzer, comprising:
   determining a plurality of initial technology parameters characterizing a circuit according to a timing model of said circuit;

expressing a delay along an entire logic path of said circuit as a function of said technology parameters;

determining a set of circuit paths having fixed topology, device sizes, and wire capacitances; and optimizing said technology parameters to minimize a plurality of errors over said set of circuit paths to obtain optimized parameters for use in said timing model.

2. A method of calibrating a circuit analyzer according to claim 1, wherein said step of optimizing includes minimizing a sum of squares of said plurality of errors.

3. A method of calibrating a circuit analyzer according to claim 1, wherein said step of optimizing includes varying said plurality of technology parameters within an optimization program to obtain a best fit of a first plurality of path delays determined using said timing model to a second plurality of path delays based on actual measurement.

4. A method of calibrating a circuit analyzer according to claim 1, wherein said step of optimizing includes varying said plurality of technology parameters within an optimization program to obtain a best fit of a first plurality of path delays determined using said timing model to a second plurality of path delays based on circuit simulation.

5. A method of calibrating a circuit analyzer according to claim 1, wherein said step of optimizing includes constraining said plurality of errors as conservative.

6. An apparatus for calibrating a circuit analyzer, comprising:

means for determining a plurality of initial technology parameters characterizing a circuit according to a timing model of said circuit;

means for expressing a delay along an entire logic path of said circuit as a function of said technology parameters;

means for determining a set of circuit paths having fixed topology, device sizes, and wire capacitances; and a processor including means for optimizing said technology parameters to minimize a plurality of errors over said set of circuit paths to obtain optimized parameters for use in said timing model.

7. An apparatus according to claim 6, wherein said means for optimizing includes means for minimizing a sum of squares of said plurality of errors.

8. An apparatus according to claim 6, wherein said means for optimizing includes means for varying said plurality of technology parameters to obtain a best fit of a first plurality of path delays determined using said timing model to a second plurality of path delays based on actual measurement.

9. An apparatus according to claim 6, wherein said means for optimizing includes means for varying said plurality of technology parameters to obtain a best fit of a first plurality of path delays determined using said timing model to a second plurality of path delays based on circuit simulation.

10. An apparatus according to claim 6, wherein said means for optimizing includes means for constraining said plurality of errors as conservative.

11. A circuit analyzer for generating a graphic representation of a predicted performance of a circuit, the circuit analyzer comprising:

an input device for inputting a plurality of circuit parameters representing said circuit;

memory and stored programs for receiving and storing said circuit parameters;

a processor that is controlled by said stored programs and accesses said circuit parameters such that said processor:

expresses a delay along an entire logic path of said circuit as a function of said circuit parameters, determines a set of circuit paths having fixed topology, device sizes, and wire capacitances, determines said circuit parameters to predict the performance of the circuit, and determines optimum circuit parameters to minimize a plurality of errors over said set of circuit paths to obtain optimized parameters for use in said processing means; and an output device that generates a graphic representation from said processed circuit parameters.

12. An apparatus according to claim 11, wherein said processor determines said optimum circuit parameters by minimizing a sum of squares of said plurality of errors.

13. An apparatus according to claim 11, wherein said processor determines said optimum circuit parameters by varying said plurality of technology parameters to obtain a best fit of a first plurality of path delays determined using said timing model to a second plurality of path delays based on actual measurement.

14. An apparatus according to claim 11, wherein said processor determines said optimum circuit parameters by varying said plurality of technology parameters to obtain a best fit of a first plurality of path delays determined using said timing model to a second plurality of path delays based on circuit simulation.

15. An apparatus according to claim 11, wherein said processor determines said optimum circuit parameters by constraining said plurality of errors as conservative.

* * * * *